United States Patent [19]

Culmer et al.

[11] 4,196,420

[45] Apr. 1, 1980

[54] EXPANDED ANALOG-TO-DIGITAL CONVERTER HAVING ONE-HALF LSB SHIFT

[75] Inventors: Daniel D. Culmer; Ronald W. Russell, both of Sunnyvale, Calif.

[73] Assignee: National Semiconductor Corporation, Santa Clara, Calif.

[21] Appl. No.: 910,506

[22] Filed: May 30, 1978

[51] Int. Cl.² .......................................... H03K 13/03
[52] U.S. Cl. ...................... 340/347 AD; 340/347 DA
[58] Field of Search ............... 340/347 AD, 347 DA, 340/347 M

[56] References Cited

U.S. PATENT DOCUMENTS

| 3,573,795 | 4/1971 | Bowers | 340/347 AD |
| 3,895,378 | 7/1975 | Marcel | |
| 3,997,892 | 12/1976 | Susset | 340/347 DA |

*Primary Examiner*—Charles D. Miller
*Attorney, Agent, or Firm*—Brown & Martin

[57] ABSTRACT

An expanded analog-to-digital converter includes a first digital-to-analog converter for converting the most significant bits of digital output signal having a given number of bits to a first analog reference signal having a value that is proportional to the value of the most significant bits minus one-half the least significant bit of the digital output signal whenever the value of the most significant bits is other than zero; and a second digital-to-analog converter for converting the least significant bits of the digital output signal to a second analog reference signal. A successive approximation register successively provides the bits of a digital output signal in accordance with a comparison of an analog input signal with the sum of the analog reference signals. A logic circuit coupled to the successive approximation register for providing an indication of whether the value of the most significant bits is other than zero, causes the second analog reference signal to have a value that is proportional to the value of the least significant bits whenever the value of the most significant bits is other than zero, and a value that is proportional to the value of the least significant bits minus one-half the least significant bit of the digital output signal whenever the value of the most significant bits is zero.

4 Claims, 3 Drawing Figures

EXPANDED ANALOG-TO-DIGITAL CONVERTER HAVING ONE-HALF LSB SHIFT

BACKGROUND OF THE INVENTION

The present invention pertains to an improvement in analog-to-digital converters.

Typical analog-to-digital converters have a capacity for converting an analog input signal to an eight-bit digital output signal.

A typical analog-to-digital converter includes a digital-to-analog converter for converting a digital output signal having a given number of bits to an analog reference signal having a value that is proportional to the value of the digital output signal minus one-half the least significant bit (LSB) of the digital output signal; a comparator for comparing an analog input signal with the analog reference signal; and a successive approximation register connected to be driven by the comparator for successively providing the bits of the digital output signal beginning with the most significant bit in accordance with said comparison of the analog input signal with the analog reference signal and for providing the digital output signal to the digital-to-analog converter to drive the digital-to-analog converter.

The one-half least significant bit offset of the analog reference signal in relation to the digital output signal is provided in order that the analog-to-digital transfer curve have a ½ LSB offset at zero, as shown in FIG. 1, wherein the maximum error of the analog-to-digital converter is only ±½ LSB. Zero quantizing error for an analog-to-digital converter is represented by the dashed line in FIG. 1.

Typical analog-to-digital converters have an eight-bit capacity based upon the eight-bit capacity of the digital-to-analog converter contained therein. It has been proposed, however, to expand the capacity of analog-to-digital converter to ten bits by combining the eight-bit digital-to-analog converter with a two-bit digital-to-analog converter, as discussed by Cecil, Solomon and Moyer of National Semiconductor Corporation in "Trends In Monolithic A/D and D/A Converter Art", CompCon Catalog, September, 1976, with the eight most significant bits of the digital output signal being converted by the eight-bit digital-to-analog converter.

In making such an expanded analog-to-digital converter, however, a typical eight-bit digital-to-analog converter cannot be used because the ½ LSB shift inherent therein becomes a 2 LSB shift when the analog reference signal derived from the two additional least significant bits is combined therewith.

SUMMARY OF THE INVENTION

The present invention provides an expanded analog-to-digital converter having a one-half least significant bit shift.

Preferably, the analog-to-digital converter of the present invention includes a first digital-to-analog converter for converting the most significant bits of a digital output signal having a given number of bits to a first analog reference signal having a value that is proportional to the value of the most significant bits minus one-half the least significant bit of the digital output signal whenever the value of the most significant bits is other than zero; a second digital-to-analog converter for converting the least significant bits of the digital output signal to a second analog reference signal; a comparator for comparing an analog input signal with the sum of the analog reference signals; a successive approximation register connected to be driven by the comparator for successively providing the bits of the digital output signal beginning with the most significant bit in accordance with the comparison of the analog input signal with the sum of the analog reference signals, for providing the most significant bits of the digital output signal to the first digital-to-analog converter to drive the first digital-to-analog converter, and for providing the least significant bits of the digital output signal to the second digital-to-analog converter to drive the second digital-to-analog converter; and a logic circuit coupled to the successive approximation register for providing an indication of whether the value of the most significant bits is other than zero; wherein the second digital-to-analog converter is responsive to the indication by the logic circuit for causing the second analog reference signal to have a value that is proportional to the value of the least significant bits whenever the value of the most significant bits is other than zero, and a value that is proportional to the value of the least significant bits minus one-half the least significant bit of the digital output signal whenever the value of the most significant bits is zero.

DESCRIPTION OF THE PREFERRED EMBODIMENTS

Figure 1:
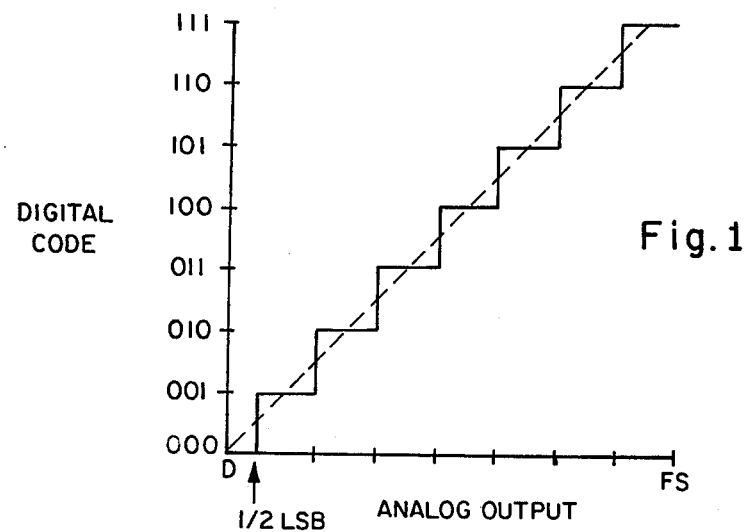
FIG. 1 is an analog-to-digital converter transfer curve having a ½ LSB shift at zero.
Figure 2:
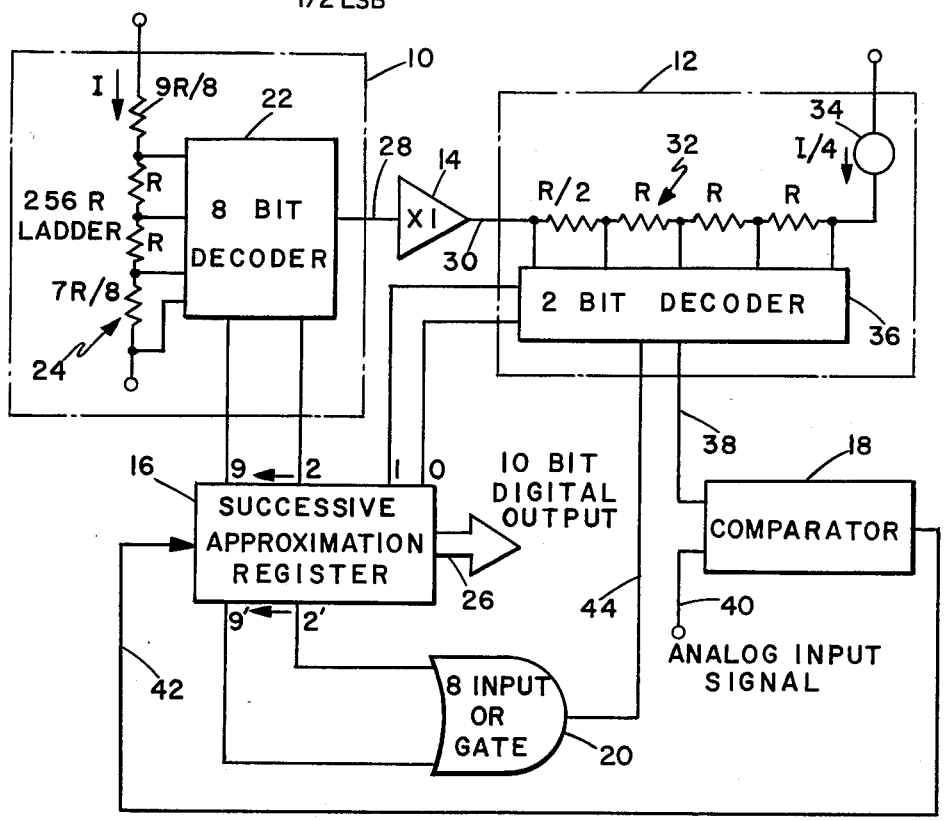
FIG. 2 is a schematic circuit diagram of one preferred embodiment of an expanded analog-to-digital converter according to the present invention.

Referring to FIG. 2, one preferred embodiment of an expanded analog-to-digital converter according to the present invention includes an eight-bit digital-to-analog converter 10, a 2-bit digital-to-analog converter 12, a buffer amplifier 14, a successive approximation register 16, a comparator 18, and a logic circuit essentially including an 8 input OR gate 20.

The eight-bit digital-to-analog converter 10 includes an eight-bit decoder circuit 22 and a 256 R resistance ladder 24. The resistance in the least significant bit position of the 256 R resistance ladder has a resistance value 7/8 R and the resistance at the opposite end of the ladder has a resistance value of 9/8 R.

The successive approximation register 16 provides a parallel ten-bit digital output signal on lines 26. The successive approximation register 16 also provides the eight most significant bits of the digital output signal on lines 2 through 9 to the first digital-to-analog converter 10 to drive the first digital analog converter 10, and further provides the two least significant bits of the digital output signal on lines 0 and 1 to the second digital-to-analog converter 12 to drive the second digital-to-analog converter 12.

The eight-bit digital-to-analog converter 12 converts the eight most significant bits of a ten-bit digital output signal to a first analog reference signal on line 28. The first analog reference signal has a value that is proportional to the value of the eight most significant bits minus one-half the least significant bit of the digital output signal whenever the value of the eight most significant bits is other than zero.

The first analog reference signal on line 28 is delivered on line 30 by the buffer amplifier 14 to the second digital-to-analog converter 12.

The second digital-to-analog converter 12 includes a series resistance network 32 having one end of the network coupled via the buffer amplifier 14 to the output of the first digital-to-analog converter 10; a current source 34 connected to the other end of the series resistance network 32; and a 2-bit decoder circuit 36. The current source 34 provides a current having a value $\frac{1}{4}$ in relation to the value of the current I provided to the 256 R resistance ladder 24 in the 8-bit digital-to-analog converter 10.

The buffer amplifier 14 prevents the current $\frac{1}{4}$ from being driven into the 8-bit decoder 22.

The two-bit digital-to-analog converter 12 converts the two least significant bits of the digital output signal on lines 0 and 1 to a second analog reference signal. The two-bit digital-to-analog converter 12 sums the second analog reference signal to the first analog reference signal on line 30 and provides the sum of the analog reference signals on line 38.

The comparator 18 compares an analog input signal received on line 40 with the sum of the analog reference signals on line 38, and provides a comparison output signal on line 42 to the successive approximation register 16.

The successive approximation register 16 is driven by the comparison output signal on line 42 from the comparator for successively providing the bits of the digital output signal on lines 26 beginning with the most significant bit in accordance with the comparison of the analog input signal on line 40 with the sum of the analog reference signals on line 38.

The eight most significant bits of the digital output signal on line 26 are provided to the 8 input OR gate 20 on lines 2' through 9' from the successive approximation register 16. The signals on lines 2' through 9' are identical to the signals on lines 2 through 9. The OR gate 20 provides an indication signal on line 44 of whether the value of the eight most significant bits on line 2' through 9' is other than zero.

Figure 3:
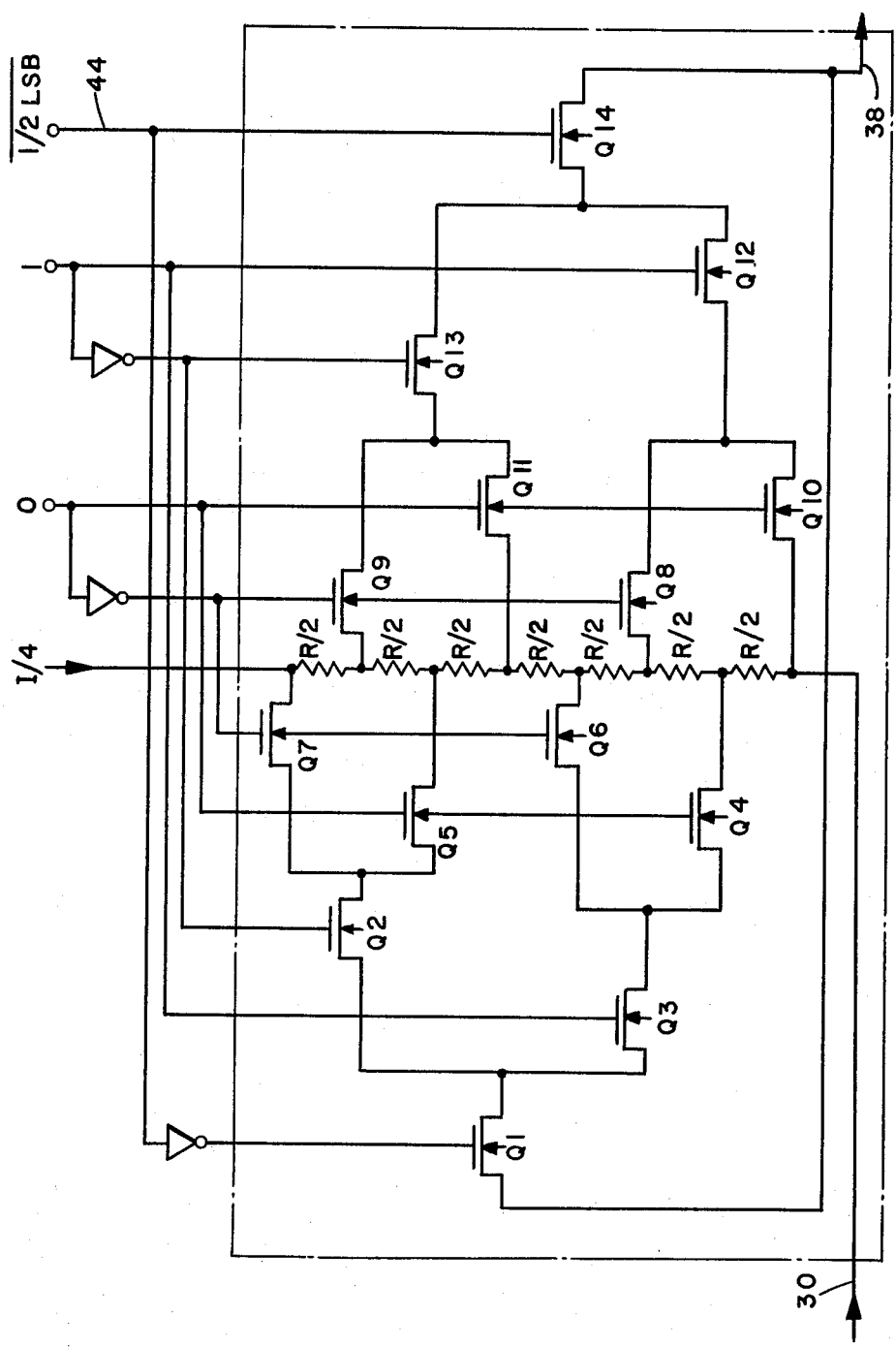
FIG. 3 is a schematic circuit diagram of the 2 BIT decoder shown in FIG. 2.

The two-bit digital-to-analog converter 12 responds to the indication on line 44 from the OR gate 20 by causing the second analog reference signal to have a value that is proportional to the value of the two least significant bits whenever the value of the eight most significant bits is other than zero, and a value that is proportional to the value of the two least significant bits minus one-half the least significant bit of the digital output signal whenever the value of the eight most significant bits is zero. This result is accomplished by the 2-bit decoder circuit 36, shown in FIG. 3.

The decoder circuit 36 includes a matrix of switches Q1 through Q14 connected to the nodes of the resistances R/2 of the series resistance network 32. Each of resistance R/2 has a resistances value that is one-half the resistance value of the individual resistances R in the 256 R resistance ladder 24. Each of the switches Q1 through Q14 is a MOSFET switching device. The switches Q1 through Q14 are controllable by the two least significant bits of the digital output signal on lines 0 and 1 and by the indication signal on line 44 for connecting certain ones of the nodes of the resistances R/2 of the series resistance network 32 to provide the second analog reference signal and to add the second analog reference signal to the first analog reference signal on line 30 for provision to the comparator 18 via line 38.

The current source 34 is described in greater detail in a copending patent application by Daniel Douglas Culmer, one of the co-inventors herein, entitled "System for Establishing and Steering a Precise Current", filed on even date herewith, the disclosure of which is incorporated herein by reference thereto.

We claim:
1. An analog-to-digital converter, comprising
a first digital-to-analog converter for converting the most significant bits of a digital output signal having a given number of bits to a first analog reference signal having a value that is proportional to the value of the most significant bits minus one-half the least significant bit of the digital output signal whenever the value of the most significant bits is other than zero;
a second digital-to-analog converter for converting the least significant bits of the digital output signal to a second analog reference signal;
a comparator for comparing an analog input signal with the sum of the analog reference signals;
a successive approximation register connected to be driven by the comparator for successively providing the bits of the digital output signal beginning with the most significant bit in accordance with said comparison of the analog input signal with the sum of the analog reference signals, for providing the most significant bits of the digital output signal to the first digital-to-analog converter to drive the first digital-to-analog converter, and for providing the least significant bits of the digital output signal to the second digital-to-analog converter to drive the second digital-to-analog converter; and
logic means coupled to the successive approximation register for providing an indication of whether the value of the most significant bits is other than zero;
wherein the second digital-to-analog converter is responsive to the indication by the logic means for causing the second analog reference signal to have a value that is proportional to the value of the least significant bits whenever the value of the most significant bits is other than zero, and a value that is proportional to the value of the least significant bits minus one-half the least significant bit of the digital output signal whenever the value of the most significant bits is zero.

2. An analog-to-digital converter, comprising
an eight-bit digital-to-analog converter for converting the eight most significant bits of a ten-bit digital output signal to a first analog reference signal having a value that is proportional to the value of the eight most significant bits minus one-half the least significant bit of the digital output signal whenever the value of the eight most significant bits is other than zero;
a two-bit digital-to-analog converter for converting the two least significant bits of the digital output signal to a second analog reference signal;
a comparator for comparing an analog input signal with the sum of the analog reference signals;
a successive approximation register connected to be driven by the comparator for successively providing the bits of the digital output signal beginning with the most significant bit in accordance with said comparison of the analog input signal with the sum of the analog reference signals, for providing the eight most significant bits of the digital output signal to the first digital-to-analog converter to drive the first digital-to-analog converter, and for providing the two least significant bits of the digital output signal to the second digital-to-analog converter to drive the second digital-to-analog converter; and logic means coupled to the successive approximation register for providing an indication of whether the value of the eight most significant bits is other than zero;

wherein the two-bit digital-to-analog converter is responsive to the indication by the logic means for causing the second analog reference signal to have a value that is proportional to the value of the two least significant bits whenever the value of the eight most significant bits is other than zero, and a value that is proportional to the value of the two least significant bits minus one-half the least significant bit of the digital output signal whenever the value of the eight most significant bits is zero.

3. An analog-to-digital converter comprising a first digital-to-analog converter for converting the most significant bits of a digital output signal having a given number of bits to a first analog reference signal having a value that is proportional to the value of the most significant bits minus one-half the least significant bit of the digital output signal whenever the value of the most significant bit is other than zero;

a second digital-to-analog converter for converting the least significant bits of the digital output signal to a second analog reference signal;

a comparator for comparing an analog input signal with the sum of the analog reference signals; and a successive approximation register connected to be driven by the comparator for successively providing the bits of the digital output signal beginning with the most significant bit in accordance with said comparison of the analog input signal with the sum of the analog reference signals, for providing the most significant bits of the digital output signal to the first digital-to-analog converter to drive the first digital-to-analog converter, and for providing the least significant bits of the digital output signal to the second digital-to-analog converter to drive the second digital-to-analog converter;

wherein the second digital-to-analog converter comprises a series resistance network having one end of the network coupled to the output of the first digital-to-analog converter;

a current source connected to the other end of the series resistance network; and a decoder circuit including a matrix of switches connected to the nodes of the resistances of the series resistance network, wherein the switches are controllable by the least significant bits of the digital output signal for connecting certain ones of the nodes of the resistances of the series resistance network to provide the second analog reference signal and to add the second analog reference signal to the first analog reference signal for provision to the comparator, and further comprising logic means coupled to the successive approximation register for providing an indication of whether the value of the most significant bits is other than zero;

wherein the decoder circuit is responsive to the indication by the logic means for causing the second analog reference signal to have a value that is proportional to the value of the least significant bits whenever the value of the most significant bits is other than zero, and a value that is proportional to the value of the least significant bits minus one-half the least significant bit of the digital output signal whenever the value of the most significant bits is zero.

4. An analog-to-digital converter comprising an eight-bit digital-to-analog converter for converting the eight most significant bits of a ten-bit digital output signal to a first analog reference signal; having a value that is proportional to the value of the eight most significant bits minus one-half the least significant bit of the digital output signal whenever the value of the eight most significant bits is other than zero;

a two-bit digital-to-analog converter for converting the two least significant bits of the digital output signal to a second analog reference signal;

a comparator for comparing an analog input signal with the sum of the analog reference signals;

a successive approximation register connected to be driven by the comparator for successively providing the bits of the digital output signal beginning with the most significant bit in accordance with said comparison of the analog input signal with the sum of the analog reference signals, for providing the eight most significant bits of the digital output signal to the first digital-to-analog converter to drive the first digital-to-analog converter, and for providing the two least significant bits of the digital output signal to the second digital-to-analog converter to drive the second digital-to-analog converter;

wherein the two-bit digital-to-analog converter comprises a series resistance network having one end of the network coupled to the output of the first digital-to-analog converter;

a current source connected to the other end of the series resistance network; and a decoder circuit including a matrix of switches connected to the nodes of the resistances of the series resistance network, wherein the switches are controllable by the two least significant bits of the digital output signal for connecting certain ones of the nodes of the resistances of the series resistance network to provide the second analog reference signal and to add the second analog reference signal to the first analog reference signal for provision to the comparator; and further comprising logic means coupled to the successive approximation register for providing an indication of whether the value of the eight most significant bits is other than zero;

wherein the decoder circuit is responsive to the indication by the logic means for causing the second analog reference signal to have a value that is proportional to the value of the two least significant bits whenever the value of the eight most significant bits is other than zero; and a value that is proportional to the value of the two least significant bits minus one-half the least significant bit of the digital output signal whenever the value of the eight most significant bits is zero.

* * * * *